United States Patent
Takagi

[19]

[11] Patent Number: 6,159,873
[45] Date of Patent: *Dec. 12, 2000

[54] METHOD FOR PRODUCING SEMICONDUCTOR DEVICE AND PRODUCTION APPARATUS OF SEMICONDUCTOR DEVICE

[75] Inventor: Mikio Takagi, Kanagawa, Japan

[73] Assignee: F.T.L. Co., Ltd., Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/623,796

[22] Filed: Mar. 29, 1996

[30] Foreign Application Priority Data

Mar. 30, 1995 [JP] Japan .................................. 7-072846
Jun. 29, 1995 [JP] Japan .................................. 7-163768

[51] Int. Cl.$^7$ ......................... H01L 21/26; H01L 21/324; H01L 21/477
[52] U.S. Cl. ......................... 438/795; 438/796; 438/799; 392/416; 392/418; 219/405; 118/50.1; 118/641
[58] Field of Search .............................. 437/247; 438/795, 438/799, 796; 392/416, 418; 219/405; 118/50.1

[56] References Cited

U.S. PATENT DOCUMENTS

| | | | |
|---|---|---|---|
| 4,417,347 | 11/1983 | Muka et al. ............................... | 373/158 |
| 4,547,256 | 10/1985 | Gurtler et al. ............................ | 156/603 |
| 4,794,217 | 12/1988 | Quan et al. ............................... | 437/247 |
| 5,060,354 | 10/1991 | Chizinsky ................................ | 29/25.02 |
| 5,245,158 | 9/1993 | Hashizume et al. ..................... | 219/390 |
| 5,387,557 | 2/1995 | Takagi ...................................... | 437/247 |
| 5,434,107 | 7/1995 | Paranjpe ................................... | 437/231 |
| 5,516,283 | 5/1996 | Schrems ................................... | 437/241 |
| 5,592,581 | 1/1997 | Okase ....................................... | 392/418 |

FOREIGN PATENT DOCUMENTS

| | | | |
|---|---|---|---|
| 61-202419 | 9/1986 | Japan ............................ | 438/FOR 407 |
| 62-2616 | 1/1987 | Japan ............................ | 438/FOR 407 |
| 63-78518 | 4/1988 | Japan ............................ | 438/FOR 407 |
| 63-265425 | 11/1988 | Japan ............................ | 438/FOR 407 |
| 2-139919 | 5/1990 | Japan ............................ | 438/FOR 407 |
| 7066148 | 10/1995 | Japan . | |
| 2 114 813 | 8/1983 | United Kingdom . | |

OTHER PUBLICATIONS

European Patent Office Communication with European Search Report for European Application No. 96105158.8 dated Sep. 6, 1996.

*Primary Examiner*—Charles Bowers
*Assistant Examiner*—Erik J. Kielin
*Attorney, Agent, or Firm*—Armstrong, Westerman, Hattori, McLeland & Naughton

[57] ABSTRACT

In a RTP (rapid Thermal Processing) of a large-diameter semiconductor wafer using a hot-wall type heating furnace, the temperature distribution of the wafer surface is made uniform by means of preliminarily heating a thermal storage plate(s) to a heat-treating temperature, and, then positioning the wafer between a pair of the thermal storage plates or in the direct proximity of a thermal storage plate. The wafer may be brought into contact with the thermal storage plate. The wafer is thus heated rapidly heated to the heat treating temperature.

2 Claims, 12 Drawing Sheets

METHOD FOR PRODUCING SEMICONDUCTOR DEVICE AND PRODUCTION APPARATUS OF SEMICONDUCTOR DEVICE

BACKGROUND OF INVENTION

1. Field of Invention

The present invention relates to a method for producing a semiconductor device and an apparatus for producing a semiconductor device.

The semiconductor includes silicon semiconductor or compound semiconductor. The semiconductor device includes a memory IC (integrated circuit), a logic circuit IC, and a thin film transistor IC.

The method for producing the semiconductor device includes the following heat treatments: (a) a CVD (chemical vapor deposition) under normal or reduced pressure, for forming a film or layer, on a wafer used for the above mentioned semiconductor device, which film or layer consists of a semiconductive material, insulating material, metal, super-conductive material; (b) a diffusion, improvement of film material, flattening of the film under the presence of a protective gas such as Ar, He, $N_2$ or the like; (c) polycrystallizing an amorphous Si layer which is formed on a glass substrate; (d) RTP (rapid thermal processing) annealing of a high-dielectric constant film, such as BST (barium strontium titanate), ST (strontium titanate), $Ta_2O_5$ or the like for improving the film properties of these materials; (e) RTP annealing of a film of $WSi_2$, $TiSi_2$ or the like for decreasing the resistivity of these materials; (f) RTP annealing of a film of $SiO_2$, PSG, BPSG, SiN, SiON or the like for flattening and densifying it; (g) RTP annealing of a ferro-dielectric film such as Y-1, BST or the like; (h) activation of the implanted ions; (i) formation of a thin film on a Si substrate by its reaction with a reaction gas, such as a $SiO_2$, SiON, SiO film or the like; and (j) nitrifying the surface of a $SiO_2$ film to an extreme thinness thickness of from 1 to 5 angstroms.

The method according to the present invention attains such uniform properties over the wafer as film thickness, impurity concentration and diffusion depth which have a relationship with the performance of a semiconductor device, without incurring the generation of slip lines in a single crystalline substrate.

The production apparatus according to the present invention enables the implementation of the above described methods using a vertical or horizontal hot-wall type heating furnace.

2. Description of Related Arts

U.S. Pat. No. 5,387,557 (hereinafter referred to as the U.S. patent) proposed by the present applicant discloses a dual-tube type RTP apparatus for producing a semiconductor device using a vertical hot-wall heating furnace, whose temperature uniformity is excellent. This RTP apparatus comprises a dual reaction tube made of quartz and consisting of an inner tube and an outer tube, an introduction conduit of the reaction gas opened at the bottom portion of the inner tube, and an evacuation conduit opened at the bottom portion of the outer tube, or an annular gas channel for withdrawing the reaction gas, formed between the inner and outer tubes arranged concentrically. These parts are heated by a resistance heater(s). A wafer(s) is first held at a low temperature, where the diffusion length extends only slightly, for example, 750° C. or less, and is then rapidly moved upwards into a high-temperature region, where it is brought into contact, for a predetermined short period of time, with the reaction gas which flows upwards in the inner tube. Immediately after the reaction, the wafer(s) is moved by a wafer-holder into the low-temperature region positioned in a bottom portion of the furnace.

A Si wafer having a diameter of 150 mm was subjected to ion implantation under the condition of $BF_2$, $3.0E15/cm^2$, and 2.30 keV. Subsequently, the so ion-implanted wafer was preliminarily held at low temperature and then annealed at 950° C. for 2 minutes in the RTP apparatus disclosed in the U.S. Patent. The sheet resistance of the wafers was approximately 220 and its distribution in the surface was within ±1% (the average value of five wafers). The ordinary heat treatment method without holding at low temperature was carried out at 850° C. for 120 minutes. The sheet resistance of the wafers was 310Ω. Similar annealing was carried out at 850° C. for 30 minutes. Then the sheet resistance was 400Ω. This value implies that the diffused, interstitial impurities are not thoroughly converted to the substitutional impurities and, hence, the impurities do not thoroughly contribute to the conduction of current. The distribution of the sheet resistance on the surface was approximately 1% in the cases of the ordinary heat treatment method.

In order to improve the temperature distribution of a plurality of wafers which are heat-treated in a conventional vertical hot-wall heat-treating furnace, the distance between the wafers has been widened. The present inventor carried out experiments in a conventional vertical hot-wall furnace and considered the temperature distribution of a wafer(s) heated in such a furnace so as to ascertain whether there are any limitations involved in the prior art with respect to the temperature distribution. This experiment is described with reference to FIG. 13.

Figure 13:
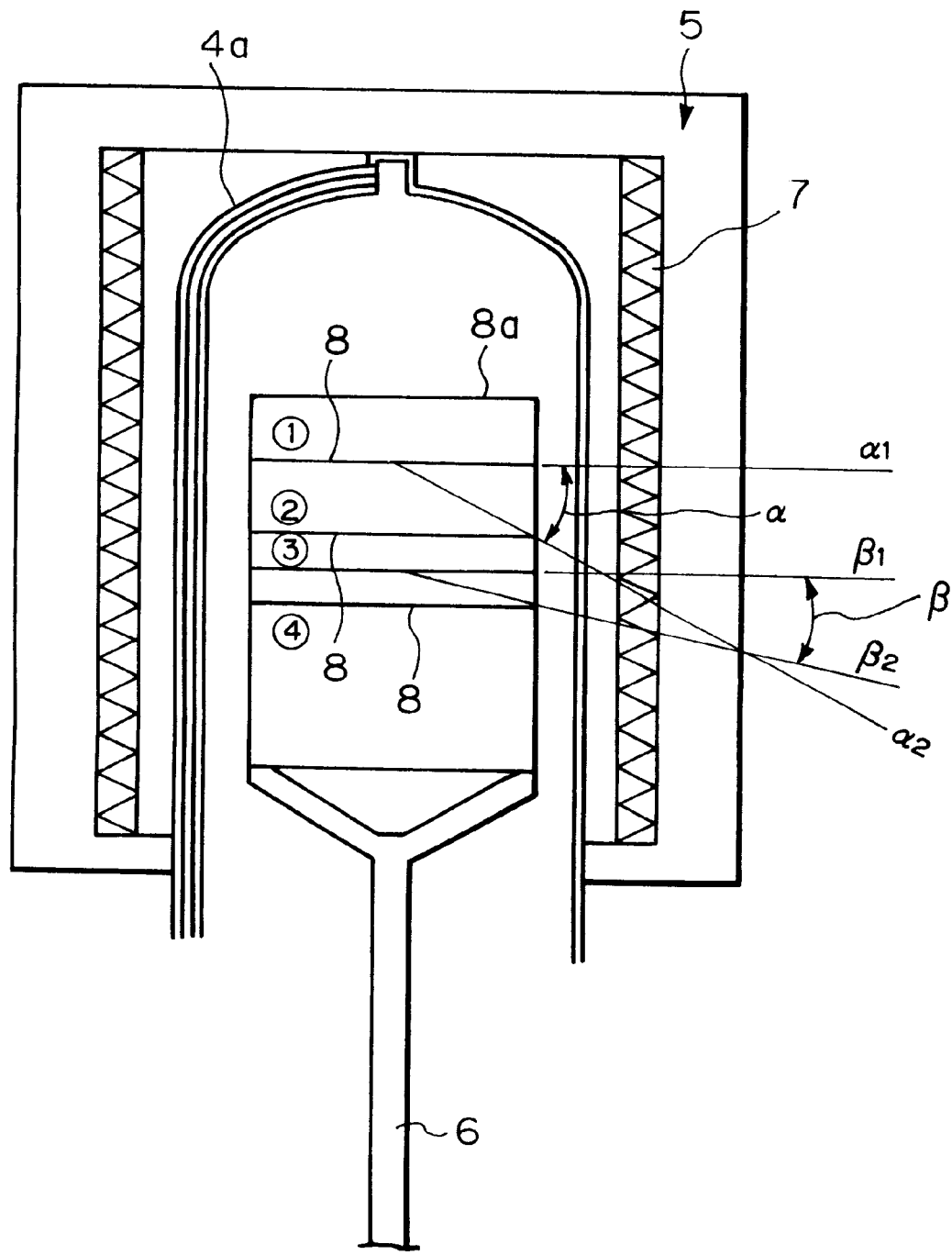
FIG. 13 is a schematic drawing illustrating how the relationship between the angle of radiant heat from a heater and the distance between the wafers exerts an influence upon the uniformity of temperature distribution on the wafer surface.

Now referring to FIG. 13, four wafers ①–④ are heat-treated in the upper, high-temperature portion of a vertical heating furnace. An evacuation conduit is denoted by reference numeral 4a and has the same function as the annular channel described in the U.S. patent. The heater is denoted by reference numeral 7. The topmost wafer 8a is a dummy wafer. The wafers 8 are positioned in an iso-thermal space created by the heater 7. The distance of these wafers is set such that the distance between the wafer ① and the lower positioned wafer ② is twice as great as that between two of the wafers ② through ④. The former distance is hereinafter referred to as the wide distance, while the latter distance is hereinafter referred to as the narrow distance. Although the gas flows downwards in the apparatus as shown in FIG. 13, the above explanation is also applied to an apparatus, in which the gas flows upwards.

Radiation becomes predominant in the heating of a wafer, when the heat temperature is 800° C. or more. Under this condition the energy imparted on the wafer is influenced by the incident angle of the radiant ray. The incident angle on the center of the wafer ①, which is positioned at the wide distance, is from $\alpha_1$ to $\alpha_2$. On the other hand, the incident angle on the center of the wafers ②, ③ and ④, positioned at the narrow distance, is $\beta_1$ to $\beta_2$. The incident angle of the radiant ray on a wafer positioned at the wide distance, is greater than that on a wafer positioned at the narrow distance. The central part of a wafer is thoroughly heated and hence the temperature distribution is liable to be uniform on the wafer positioned at the wide distance, so that the temperature difference between the central and peripheral portions of a wafer is lessened. A greater distance between the wafers is, therefore, more preferred in the light of improving the uniform heating characteristics of wafers. Excessively great distance between the wafers is, however, not recommended, because the number of wafers treated in one batch of heat treatment decreases.

Similarly, the temperature difference between the central and peripheral portions of a wafer can be lessened by means of moving the peripheral portion of a wafer(s) farther away from a heater, which necessarily incurs, however, increase of the inner diameter of the heating furnace.

Based on the considerations described with reference to FIG. 13, the present inventor evaluated the distance between the wafers in an RTP heating furnace, under which the distribution of sheet-resistance on the wafer surface can attain 1%, which is the best value practically attained in an ordinary diffusion furnace but not an RTP furnace.

The wafers, which had been ion-implanted under the above described condition, were heat-treated in an experimental furnace having an inner diameter of 270 mm. The values obtained by the experiments were as follows.

| Diameter of Wafer (inch) | Wafer Distance (mm) |
|---|---|
| 6 | approximately 40 |
| 8 | approximately 50 |
| 12 | approximately 75 |

Now, from the viewpoint of increasing the number of wafers treated in an apparatus at one time, that is, the viewpoint of cost reduction, the number of wafers treated should preferably as large as possible. Treatment of a plurality of wafers is, therefore, evidently more advisable than treatment of a single wafer. Practically, treatment of at least five wafers is expected. A high-temperature region, in which five 8-inch wafers are arranged at distances as described above, a low-temperature region and a transition region between the high- and low-temperature regions amount to the total length or height of an apparatus of slightly more than 3 meters. Similarly, the total length or height of an apparatus, in which five 8-inch wafers are arranged at distances as described above, amounts to 3.5–4.0 meters. Such a tall apparatus makes maintenance, inspection and repair of an apparatus difficult. In addition, the installation place of such apparatus is limited.

Heretofore, a peripheral portion of a large-diameter wafer is cooled by a cooling ring so as to prevent such portion from being locally heated to higher temperature than the central portion. This method necessitates, however, a cooling ring and employs a means which is contrary to the RTP.

Meanwhile, it is disclosed in the U.S. patent that a plurality of wafers are located vertically and are displaced between the high- and low-temperature regions along the direction of the wafer surface. Also in this case, the uniformity of sheet resistance on the wafer surface can be improved by widening the wafer distance. However, the diameter of the apparatus disadvantageously increases, as described with reference to FIG. 13.

As is described hereinabove, the diameter increase of a vertical heating furnace encounters difficulty. Contrary to this, a 1000 mm or more iso-thermal region can be formed easily in a horizontal heating furnace. Although the diameter increase of a vertical furnace encounters difficulty as is described hereinabove, a 1000 mm or more iso-thermal region can be formed easily in a horizontal heating furnace. Although the horizontal furnace has this advantage, the horizontal heating furnace has not been used for treating a large-diameter wafer of 8 mm or more in diameter, because the foot print becomes very great such as 1.5×8–1.5×11 m², which is from five to 7 times as large as in the vertical heating furnace. In addition, since RTP is not necessary for manufacturing 4–16M DRAMs (dynamic random access memories), for whose production 6-inch wafers are used, no consideration has been given as to how to realize RTP in a horizontal heating furnace.

The present inventor considered under such circumstance that the RTP with the use of a horizontal heating furnace is more advisable than that with the use of a vertical heating furnace, which necessitates construction of a clean room as tall as 5 meters or more. Thus, the building cost of a clean room is saved.

SUMMARY OF INVENTION

As described above, a relationship exists whereby uniformity on the surface of a large-diameter wafer is maintained as the distance between wafers is widened. Heat treatment of a single wafer attains better temperature distribution than that of a plurality of wafers, provided that the diameter of the wafer is 8 inches or less, because the distance between the heater 7 (FIG. 13) and a single wafer exerts only a slight influence upon the temperature distribution of the single wafer being heat treated.

Diameter increase of a wafer causes non-uniformity in temperature distribution in such a manner that it is low at the central portion and high at the peripheral portion of the wafer. This diameter increase progresses concurrently with the miniaturization of semiconductor devices. Therefore, in order to enhance the performance of minute devices and to maintain high yield the permissible conditions for uniform temperature distribution on a large-diameter wafer become more severe as compared with a small-diameter wafer.

It is therefore an object of the present invention to provide a method for producing a semiconductor device, in which the uniformity of properties on a large-diameter wafer or wafers being heat treated can be improved.

It is also an object of the present invention to provide an apparatus for producing a semiconductor device, in which the uniformity of properties on a large-diameter wafer or wafers being heat treated can be improved.

In accordance with the objects of the present invention, there is provided a first method for producing a semiconductor device, in which a wafer or wafers are arranged and heat treated in a hot-wall type heating furnace, comprising the steps of:

preliminarily heating a plurality of opposed thermal storage plates to a heat-treating temperature; and, subsequently, positioning one wafer or opposed two wafers between the opposed thermal storage plates, in such a manner that essentially entire surface of the wafer or wafers is opposite to at least a partial region of the thermal storage plates, thereby rapidly heating the wafer or wafers at said heat-treating temperature.

In accordance with the objects of the present invention, there is provided a first apparatus for producing a semiconductor device, comprising:

a hot-wall type heat-treating furnace having a heat-treatment region, a plurality of opposed thermal storage plates provided in the heat-treatment region and separated from one another at such intervals that one wafer or opposed two wafers can be introduced into and withdrawn from a space between the two opposed thermal storage plates; and, a holding means for displacing a wafer or wafers into and from the heat-treatment region and positioning the wafer or the opposed two wafers between the thermal-storage plates.

In accordance with the present invention, there is also provided a second method for producing a semiconductor device, in which a wafer or wafers are arranged and heat-treated in a hot-wall type heating furnace, comprising the steps of:

preliminarily heating a thermal storage plate to a heat-treating temperature; and, subsequently, bringing each wafer into contact with the thermal storage plate over essentially entire surface of the wafer or wafers or holding each wafer in the direct vicinity of the thermal storage plate over essentially entire surface of the wafer or wafers, thereby rapidly heat-treating the wafer or wafers at said heat treating temperature.

There is also provided a second apparatus for producing a semiconductor device, comprising:

a hot-wall type heat-treating furnace having a heat-treatment region;

a thermal storage plate provided in the heat-treatment region; and, a holding means for displacing a wafer or wafers into and from a heat-treatment region and bringing each wafer into contact with the thermal storage plate over essentially the entire surface of the wafer or holding each wafer in the direct vicinity of the thermal storage plate.

There is also provided a third method for producing a semiconductor device, comprising:

a hot-wall type heat-treating furnace having a heat-treatment region;

a thermal storage plate provided in the heat-treatment region; and, a holding means for displacing a wafer or wafers into and from a heat-treatment region and bringing each wafer into contact with the thermal storage plate over essentially the entire surface of the wafer.

There is also provided a third apparatus for producing a semiconductor device,

19. An apparatus for producing a semiconductor device, comprising:

a hot-wall type heating furnace having a heat-treatment region:

a heater for heating the furnace interior to a heat-treatment temperature; and, a means for holding and displacing a wafer or wafers into and from the heat-treating region of the hot-wall type heating furnace; of said heater has a surface perpendicular to the displacing direction of the holding means and, further, the holding means is capable of displacing the wafer or wafers until it is held in the direct vicinity of the heater.

Hereinafter, the present invention is described in detail.

In the heat treatment of a wafer(s), the wafer(s) must be or may not be held preliminarily at a low temperature. An example of the former case is certain RTP, e.g., activation of the implanted ions, reflow of B-PSG (boron phosphosilicate glass) and the like. Another example of the former case is annealing of TiN at 600–750° C. after low-temperature treating at 300–450° C. to mitigate any stress accumulated in the TiN film deposited or laminated on the wafer surface. An example of the latter case is annealing of TiN at 600–750° C. without the low-temperature treatment. Although the two-stage treatment is evidently advantageous, the present invention can be applied to both cases.

Furthermore, the methods according to the present invention can enhance the temperature uniformity on the wafer surface, when a wafer(s) is heat-treated or surface-treated. Hereinunder, a description is mainly given with respect to a method, in which a wafer(s) is held preliminarily in a low-temperature region of the hot-wall type heating furnace which is provided with also a low-temperature region and then displaced into the high-temperature region in which a thermal storage plate is preliminarily heated.

In the methods of the present invention, a wafer(s) is located in a hot-wall type heating furnace and is held at an upright position and is displaced in a direction parallel to the wafer surface between the high- and low-temperature regions of a vertical furnace. Alternatively, a single wafer is held horizontally and is displaced in a direction perpendicular to the wafer surface between the high- and low-temperature regions of a vertical furnace. A wafer(s) may be held by any known other methods.

The high- and low-temperature regions herein indicate spaces, each having a constant temperature and a certain length sufficient to uniformly heat the wafer(s) to said constant temperature. The high temperature is usually 700–800° C. at the lowest and 1100° C. at the highest in RTP, and may be 950° C. at the highest in a specific production of ULSI at present. An RTP may be carried out at 700° C. at the highest in future. In this case, the lower temperature should be at least 100° C. lower than the high temperature. The holding time at the low- and high-temperature regions should be short enough so that impurities diffuse only within a negligible distance. The disclosure of the U.S. patent is referred to herein with regard to the holding time.

Single or dual tube, a wafer-holding equipment, a gas-introducing inlet, and a gas-evacuating outlet, which are known to the persons skilled in the art, are provided optionally in the present invention.

DESCRIPTION OF PREFERRED EMBODIMENTS

1. First Method and Apparatus

The present invention is hereinafter described with reference to the first method and apparatus. The thermal storage plates are heated to the high temperature before a wafer(s) is displaced into the high-temperature region. The wafer(s), which has been preliminarily heated to the low temperature, is then heated to the high temperature between the thermal storage plates, which are one of the heat sources. Namely, the thermal storage plates are heated to a high temperature, for example 950° C., and then they heat a wafer(s) to 950° C. as one of the heat sources. The temperature of a wafer is elevated from a low temperature, for example 750° C., to 950° C. in a very short period of time, due to radiant heat from the thermal storage plates in addition to the heater. This radiant heat imparts energy to a wafer(s) at the time of the very beginning of heating, where the distribution of resistivity on the wafer surface is greatly influenced by the thermal energy.

When the heat-treating temperature is low. for example, 700° C., the conduction of heat is predominant over the radiation of heat. The heat-treatment is carried out usually under normal pressure so as to realize the conduction of heat from the gas between wafer(s) and the thermal storage plate. Since the wafer(s) is positioned in the direct proximity of the thermal storage plate, the gas mentioned above is well heated to the heat-treating temperature and contributes to rapid temperature rise of a wafer(s).

The size of the thermal storage plates in terms of the minimum diameter or width is preferably approximately the same as or greater than the size of a wafer. The incident angle of radiant heat from a thermal storage plate onto a wafer varies from a very small angle to about 180°, so that the entire surface of a wafer is uniformly heated simultaneously.

The maximum size of a thermal storage plate is not limited, and hence can be as twice or more as great as the diameter of a wafer. In this case, two or more wafers may be aligned in a vertical or horizontal direction between a pair of the opposed thermal storage plates. When the wafers are arranged as above, the furnace becomes, however, disadvantageously tall or wide. Since restrictions on the length of a building are not as severe as on height, the thermal storage plates having a diameter twice or more as great as the wafer-diameter can be arranged in a horizontal heating furnace, without causing any problem.

The number of wafers to be heat treated is the same as in the conventional method, and can be from five to ten in the case of a vertical heating furnace. From ten to twenty five wafers can be batch treated in a horizontal heating furnace, since the iso-thermal region having a length of from 500 to 800 mm can be easily formed in such furnace.

One wafer or two opposed wafers can be located between the opposed thermal storage plates. When three opposed wafers are located between a pair of the thermal storage plates, the middle wafer is not subjected to the radiant heat from the thermal storage plates and is hence not uniformly heated.

A thermal storage plate may consist of any one of various metals or ceramic materials having a higher melting point than the heat-treating temperature and emitting no contaminant matter detrimental to the semiconductor device. Preferably, single crystalline silicon, polycrystalline silicon, $SiO_2$, SiC, carbon, $Si_3N_4$, metal silicate such as $WSi_2$ and $TiSi_2$, W, $Al_2O_3$, AlN, or BN are used. In addition, a silicon sheet or a sheet of any one of the above materials may be covered with another material, e.g., $Si_3N_4$. A single crystalline silicon wafer with high purity is easily available and can be worked easily. The material of the thermal storage plate should, therefore, preferably be silicon when semiconductor devices are to be produced on another silicon wafer.

The material of the thermal storage plate, which is the same as that formed on the surface of a wafer, is preferably selected from the above mentioned materials. For example, the thermal storage plate consists of metal silicide, when metal silicide is to be formed on the surface of a wafer. Alternatively, the thermal storage plates also preferably consist of the same material as the surface material of a wafer, subjected to improvement of the properties by heat treatment. For example, the thermal storage plates consist of polycrystalline silicon, when a polycrystalline silicon layer has been formed on the wafer surface and ion-implanted and is then to be annealed.

In order to attain the RTP, a wafer(s) is moved at a high speed ordinarily up to 10–30 cm/second between the high and low-temperature regions. One or two wafers are preferably positioned in the middle between a pair of the thermal storage plates and held parallel to the thermal storage plates during the heat treatment, because the wafer(s) can neither interfere nor contact with the thermal storage plates and, further, the controlling mechanism for displacing a wafer-holder can be simplified.

A wafer(s) and thermal storage plates are held upright in a vertical furnace, while a wafer(s) and the thermal storage plates are held upright or horizontally in a horizontal furnace. In the latter case, the thermal storage plates can be located in a diagonal position between the vertical and horizontal positions, although this position is not preferable.

A wafer is usually from 0.6 to 0.8 mm thick. It is estimated that such wafer, which has been displaced into a high-temperature region, is uniformly heated to the high temperature within a period of two to three minutes after the displacement, provided that the thickness of the thermal storage plate(s) is 2 mm or more. This thickness is preferably from 2 to 10 mm and should be adjusted depending upon the distance between each wafer and the thermal storage plates. The thermal storage plates can be heated from the room temperature up to the high temperature before the beginning of heat treatment within a time period not exceeding 30 minutes. This time usually is 20 minutes or less.

The first apparatus according to the present invention comprises the above members arranged so as to carry out the method described hereinabove. The arrangement of the wafer-holder is, however, such that a wafer(s) is advanced into and held in a space between the thermal storage plates and is then retracted from the space after the heat treatment.

2. Second Method and Apparatus

Preferred embodiments of the second method and apparatus are described hereinafter. The material, size and thickness of the thermal storage plates are the same as those of the first method and, hence, their description is omitted.

In the second method of the present invention, a wafer(s) is held and heat-treated in a hot-wall type heating furnace, and is characterized in that a thermal storage plate is preliminarily heated to a heat-treating temperature and, subsequently, the wafer(s) is brought into contact with the thermal storage plate(s) over essentially the entire surface of the wafer(s), or is held in the vicinity of the thermal storage plates, thereby rapidly heat-treating the wafer(s) at said heat treating temperature. The heat sources, which are the thermal storage plates and the heater as in the first method, elevate the temperature of the central to the peripheral portions of a wafer(s) in a very short period of time from a low temperature, e.g., 750° C., to the heat treatment temperature, e.g., 950° C.

When a wafer(s), on one surface of which the semiconductor devices are being produced, is heated to a low temperature, then displaced in a heating furnace and said one surface approaches the thermal storage plates, this wafer surface is subjected to the radiant heat from the thermal storage plate. In order to suppress the tendency as described with reference to FIG. 13, that is, the peripheral portion of a wafer(s) tends to be heated by the heater to a higher temperature than the central position, the wafer(s) must be located in the direct vicinity of the thermal storage plate or be brought into contact with the thermal storage plate. The direct vicinity indicates preferably a distance of 10 mm or less between the wafer(s) and the thermal storage plate.

The heat treatment according to the present invention may be diffusion or anneal, wherein the film formation by CVD is not carried out at all. In this case, a wafer(s) may be brought into contact with the thermal storage plate, because more uniform heating of a wafer(s) is attained than by heating it in the direct vicinity of the thermal storage plate. Since the wafer(s) is in contact with the thermal storage plate(s), the thermal conduction predominates over the radiation for heating the wafer(s). The entire surface of a wafer(s) is, therefore, instantaneously heated up to the heat-treating temperature, when the wafer(s) is brought into uniform contact with the thermal storage plate. The thermal storage plate preferably consists of the same material as the wafer(s) so as to avoid the contamination of the latter by the impurities from the former.

In the second apparatus according to the present invention, such members as the thermal storage plates and the heaters are arranged so as to carry out the method described above. In addition, the holding means of a wafer (s) advances a wafer(s) into the direct vicinity of the thermal storage plates or brings a wafer(s) into contact with the thermal storage plates. The holding means then holds the wafer(s) at the position to which it is advanced as described above, and retracts the wafer(s) after completion of the heat treatment.

3. Third Method and Apparatus

In the third method of the present invention, a wafer(s) is subjected to heat treatment in the direct proximity of a heater of a hot-wall type heating furnace. The wafer(s) is positioned at a distance of 10 mm or less from the heater during the heat-treatment. Since the temperature of the heater of a hot-wall type heating furnace is the heat-treating temperature, the heater has the same effect as the thermal storage plate as described above. When the wafer(s) is positioned in the direct vicinity of a heater, it is uniformly heated over the entire surface and is rapidly heated; the temperature difference between the peripheral and central parts is thus decreased as described in the second method.

The present invention is hereinunder described with reference to FIGS. 1 through 12.

Figure 1:
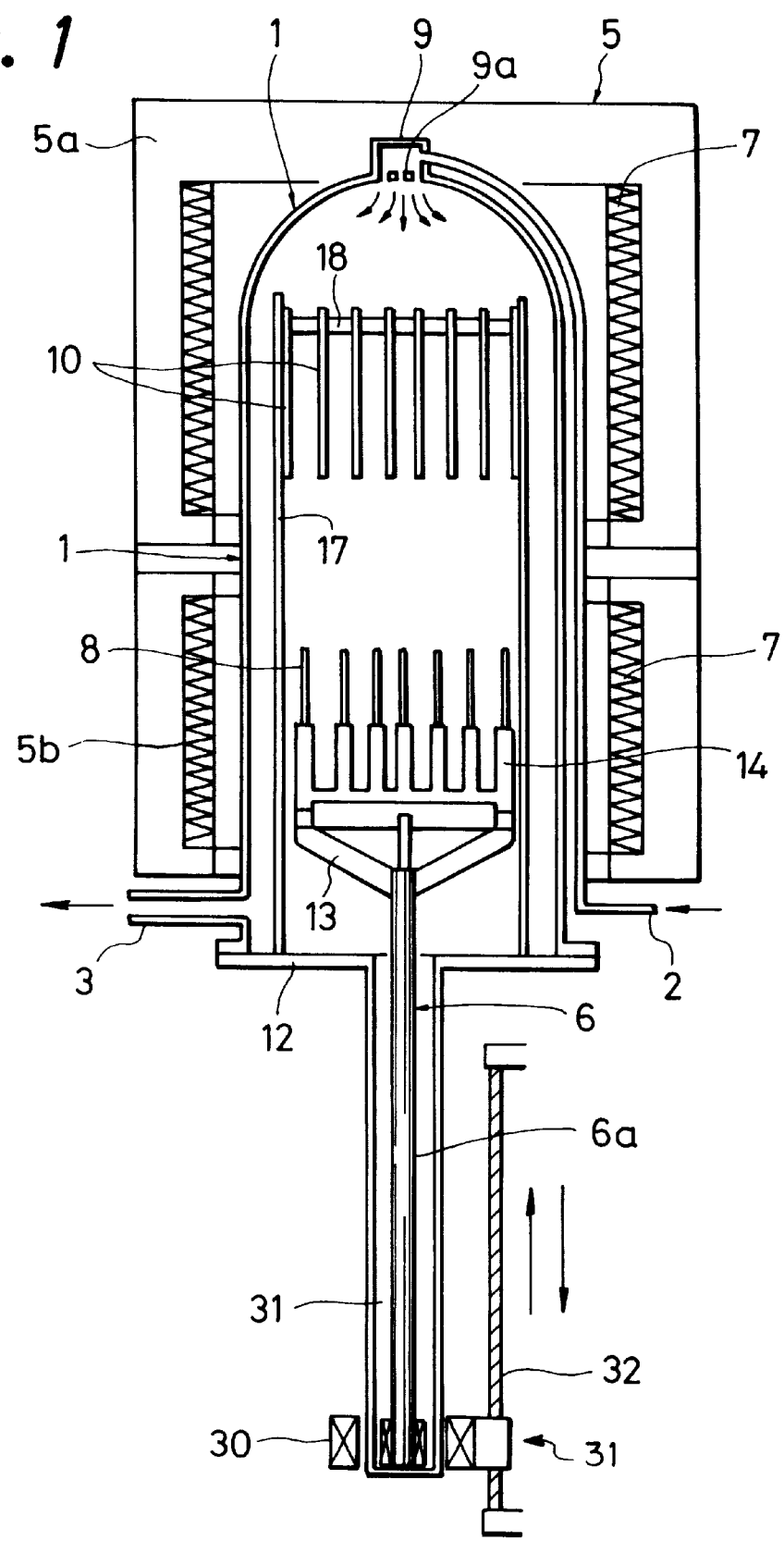
FIG. 1 illustrates a vertical heating furnace, in which wafers are heated at low temperature, and an embodiment of the method according to the present invention.
Figure 2:
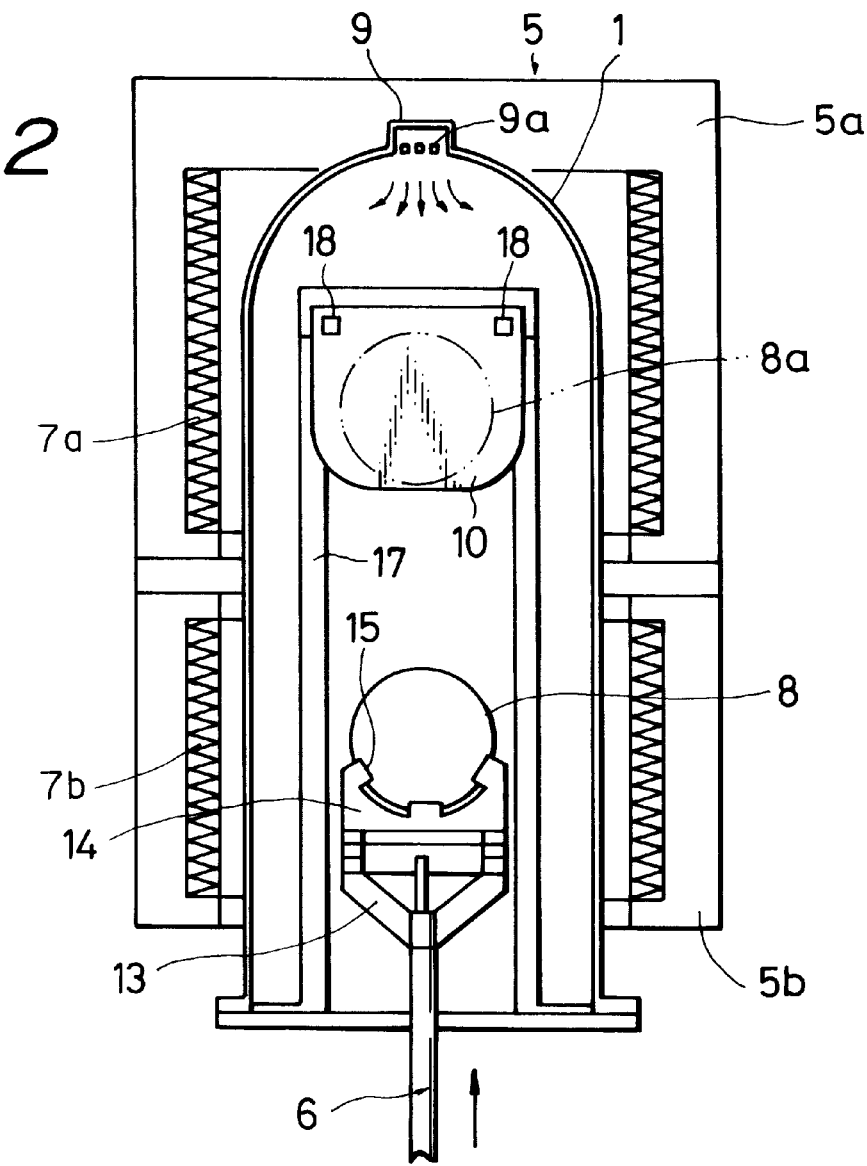
FIG. 2 shows the vertical heating furnace of FIG. 1 as seen from the wafer surface.
Figure 3:
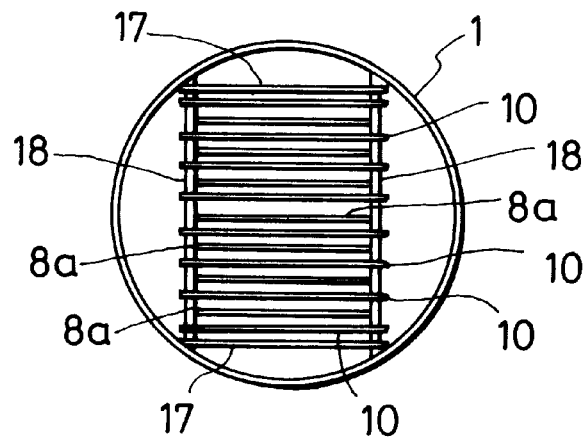
FIG. 3 is a plan view illustrating thermal storage plates used in the apparatus shown in FIG. 2.

Referring to FIGS. 1 through 3, it would be apparent how the first method according to the present invention can be applied to a vertical type, evacuated CVD apparatus.

The members, of which the apparatus shown in FIG. 1 is comprised, are a quartz reaction tube 1, a reaction-gas inlet conduit 2 opened at the bottom of the quartz reaction tube 1, an exhaust conduit 3 opened at the bottom of the quartz reaction tube 1, a heating furnace 5 provided with the resistance heaters 7, a lifting rod 6a or vertically moving a wafer(s) at a high speed usually from 10 to 30 cm/sec, a shielding plate 12, a magnet coil or permanent magnet 30, a driving means 31, and a means for holding the magnet coil or magnet 30. The heating furnace 5 is separated into an upper furnace 5a and a lower furnace 5b. The resistance heaters 7a and 7b are secured to the inner surface of each of the upper and lower furnaces 5a and 5b, respectively.

The reaction gas or carrier gas is introduced through the reaction-gas inlet conduit 2 and is then heated by the resistance heaters 7a and 7b. The reaction gas or the like is then caused to flow into the quartz reaction tube 1 through the cylindrical connecting part 9, then the honeycomb apertures 9a provided at the bottom of connecting part 9.

Seven wafers 8 are heated to a temperature of usually from 700 to 750° C. in the lower furnace 5b. This temperature corresponds to that of a preliminary heating which is carried out before RTP for activating the implanted ions.

The wafer-holding means 6 comprises a lifting rod 6a and the following members fixed integrally. Four arm members 13 are extended upwards diagonally from the top of the lifting rod 6a. A supporting plate is fixed on the top end of the arm members 13 and a means for vertically holding the wafers is provided on the top of the supporting plate. This means comprises vertical plates 14 parallel to one another. Each wafer 8 is held by three nibs 15 (FIG. 2). A slit having a depth of a few mm is formed in each nib 15 for sandwiching the peripheral edge of the wafers 8. The seven wafers 8 are held at the same intervals between them and are vertically displaced in a direction parallel to the wafer surface.

Eight thermal storage plates 10 are provided in the quartz reaction tube 1. Each of the thermal storage plates 10 is of slightly greater size the wafer(s) 8 and consists of a single plate. The thermal storage plates 10 are suspended from and fixed to the two rods 18 protruding through the upper part of the thermal storage plates 10. They 10 are held at the same intervals between them and fixed in the high-temperature region. The rods 18 are secured, at both ends, to the vertical plates 17 which are secured, at their ends, to the shielding plate 12.

When the wafer-holding means 6 is vertically lifted above into the upper furnace 5a, the RTP starts. Each wafer 8 is positioned between a pair of the thermal storage plates 10 (FIG. 2), while the periphery 8a of the wafer 8 is kept inside the the peripheral edge of the thermal storage plates 10 (FIG. 3).

Instead of the apparatus shown in FIG. 1, the apparatus shown in FIG. 1 of U.S. Pat. No. 5,387,557 can be used. Although the heating furnace shown in FIG. 1 has two zones, the present invention can be applied to a heating furnace having three zones or more with different temperatures.

Figure 4:
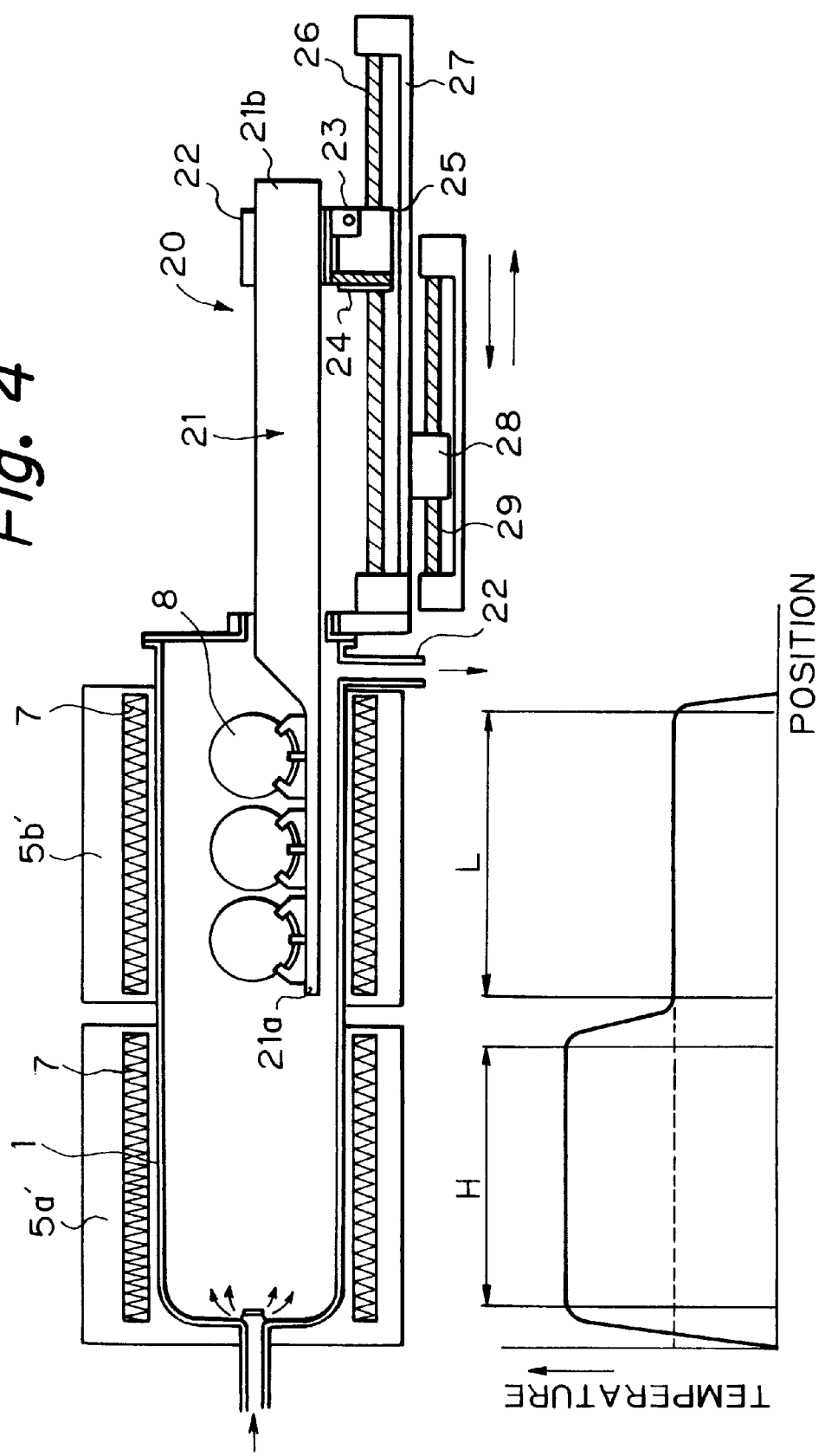
FIG. 4 illustrates a horizontal heating furnace, in which wafers are heated at low temperature, and an embodiment of the method according to the present invention. The thermal storage plates are not shown.
Figure 5:
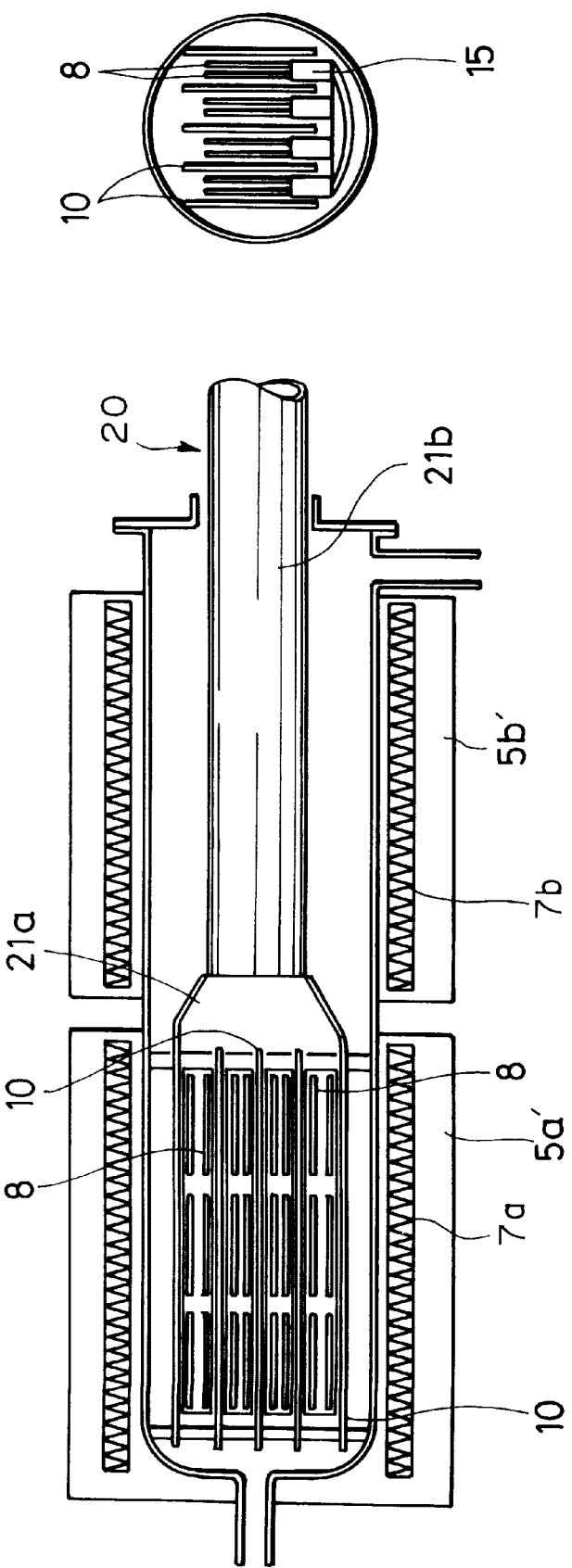
FIG. 5 is a plan view of a horizontal heating furnace, in which the wafers are heated at a high temperature, as seen from above the thermal storage plates, and is also a side view of the thermal storage plates, and illustrates an embodiment of the method according to the present invention.

Referring to FIGS. 4 and 5 is shown a horizontal CVD apparatus under normal pressure, in which the present invention is applied.

In FIG. 4, the wafers 8 are held in the low-temperature zone (L) of a low-temperature furnace 5b' and are heated to a low temperature. In FIG. 5, the wafers 8 are held in the high-temperature zone (H) and are heated to a high temperature. A pair of the wafers 8 is heated between the thermal storage plates 10 in the embodiment illustrated in FIG. 4. Evidently, a single wafer 8 may, however, be heated between the thermal storage plates 10.

A wafer holder 20 shown in FIGS. 4 and 5 holds the wafers 8 by a known cantilever mechanism and displaces them 8 without contact with the reaction tube. The wafer holder 20 comprises a jig 21 which guides the wafers 8 placed thereon, and whose front end is thinned. The jig 21 is connected to the controlling mechanism described hereinbelow. Four rows of wafer pairs are arranged longitudinally and three rows of pairs are arranged traversally on the jig (FIG. 5). The jig 21 is in the form of a plate at a front portion and in the form of a tube at the rear portion. The intermediate connecting portion is in the form of a solid rod whose cross sectional shape changes from a circle to a sheet, in order to decrease the diameter of the heating furnace and the power of a driving means for displacing the wafer holder 20.

A collar 22 (FIG. 4) is secured to the rear end 21b of a jig 21 by means of shrinkage fitting or the like. The collar 22 is provided with a lug 23 at its bottom. The jig 21 is connected to a chuck 25 by a bolt through the lug 23. Since the worm gear 24 is rotatably mounted on the chuck 25 and is rotatably engaged with the worm 26, the jig 21 can be advanced and retracted in the furnace along with movement of chuck 25. The worm 26 is held at its ends by the holder 27 which is connected to the worm gear 28. When the worm 29 rotates, the worm gear 28 is displaced in the direction of the arrow, with the result that the wafers 8 can be loaded into and withdrawn out of the furnace.

As shown in FIG. 5, six wafers 8 can be simultaneously heated at a position between a pair of the thermal storage plates 10, which have a length approximately 3.5 times as large as the wafer diameter and a height approximately 1.2 times as large as the wafer diameter.

A plurality of the horizontal furnaces as described above can be stacked vertically in multi-rows.

Figure 6:
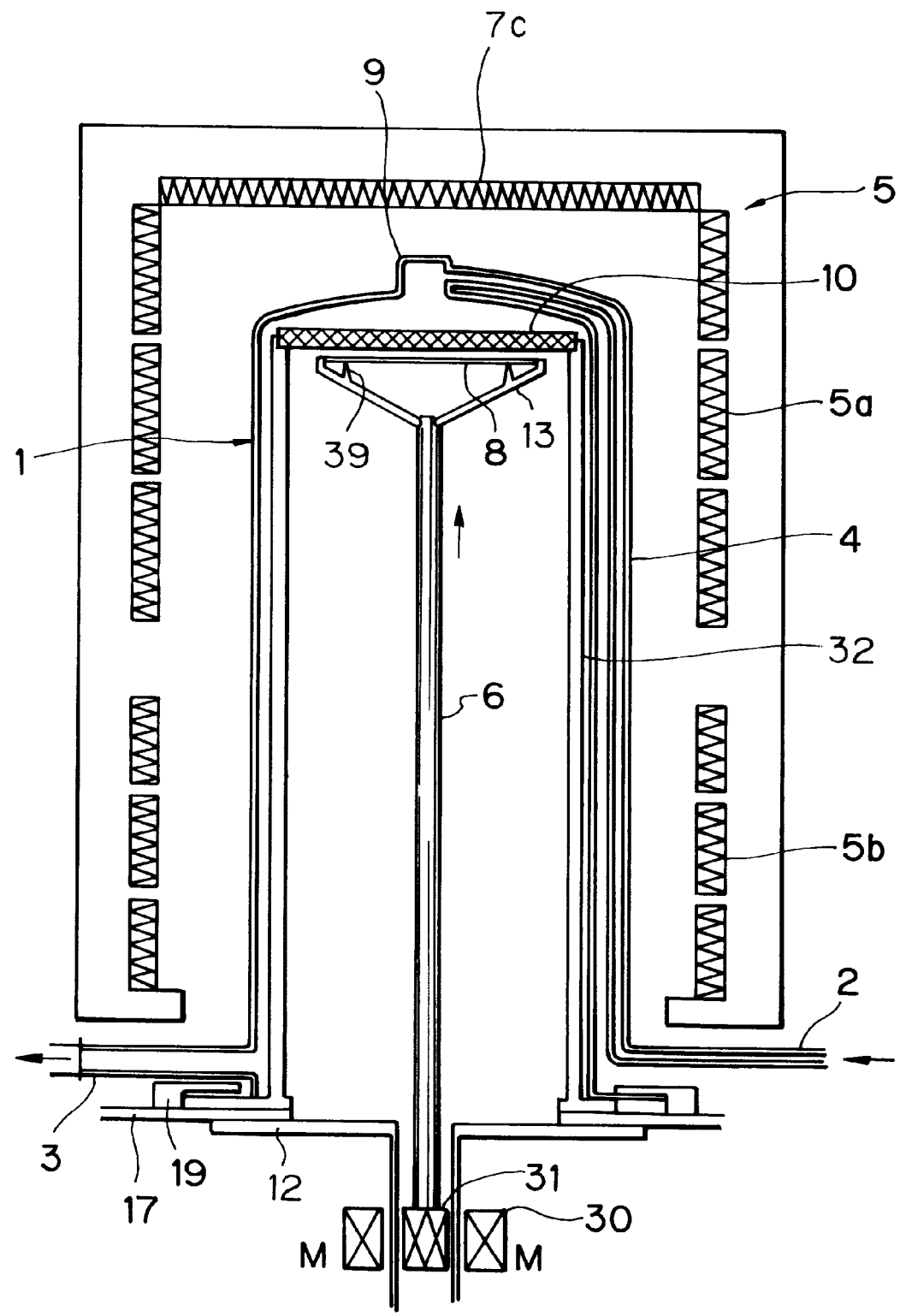
FIG. 6 is a schematic view of a vertical heating furnace, in which a wafer is located in the direct vicinity of a thermal storage plate and is heated by the thermal storage plate and a resistance heater, and illustrates an embodiment of the method according to the present invention.

FIG. 6 shows a vertical evacuated CVD apparatus, in which the second method of the present invention is applied. The members denoted by numbers 1, 2, 3, 5, 6, 10, 12, 30 and 31 are the same members as shown in FIG. 1. The member denoted 7c is a resistance heater secured on the inner top wall of the heating furnace 5. The arm members 13 of a wafer holder 6 are provided with vertical extensions whose front end 39 is tapered and pointed, so as to decrease the contact area between the wafer 8 and wafer holder, and hence to improve the rapid heating characteristic of a wafer.

In FIG. 6, the thermal storage plate 10 is a single plate and has a size slightly greater than the wafer size. The thermal storage plate 10 is held at a predetermined position by means of a supporting jig 32 which may be two or more rods or strips. Its L shaped bottom is fixed by the presser foot 19 onto the bottom plate 17. The bottom plate 17 also supports the quartz reaction tube 1. Incidentally, the thermal storage plate 10 may be suspended from and fixed to the quartz reaction tube 1 by means of, for example, a rod.

The wafer 8 may be held preliminarily at a low temperature in the lower furnace 5b. Although the heating furnace shown in FIG. 6 has two zones, three or more zones having different temperatures may be formed in a heating furnace.

Figure 7:
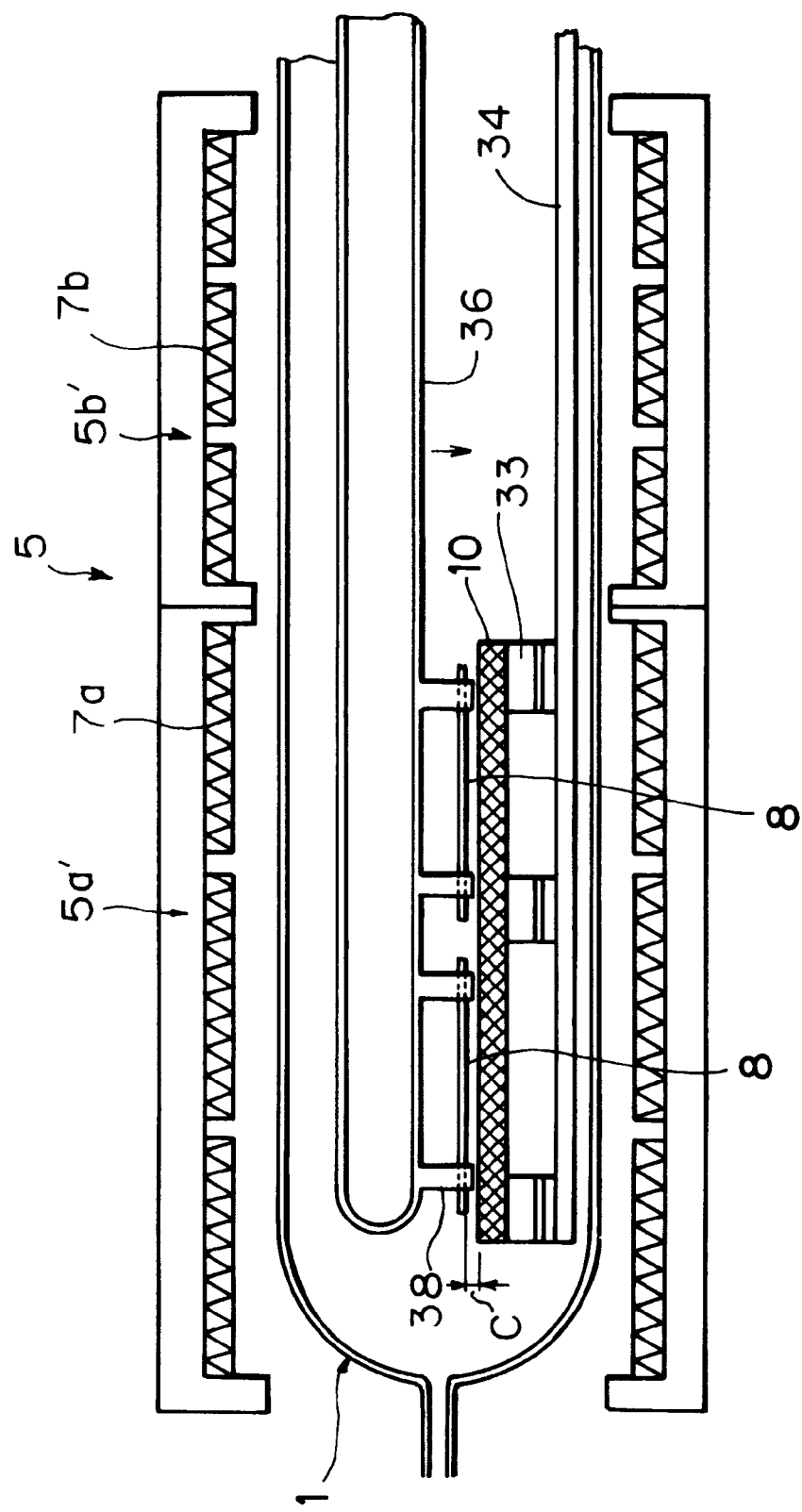
FIG. 7 is a schematic view of a horizontal heating furnace, in which a wafer is located in the direct vicinity of a thermal storage plate and a resistance heater, and illustrates an embodiment of the method according to the present invention.
Figure 8:
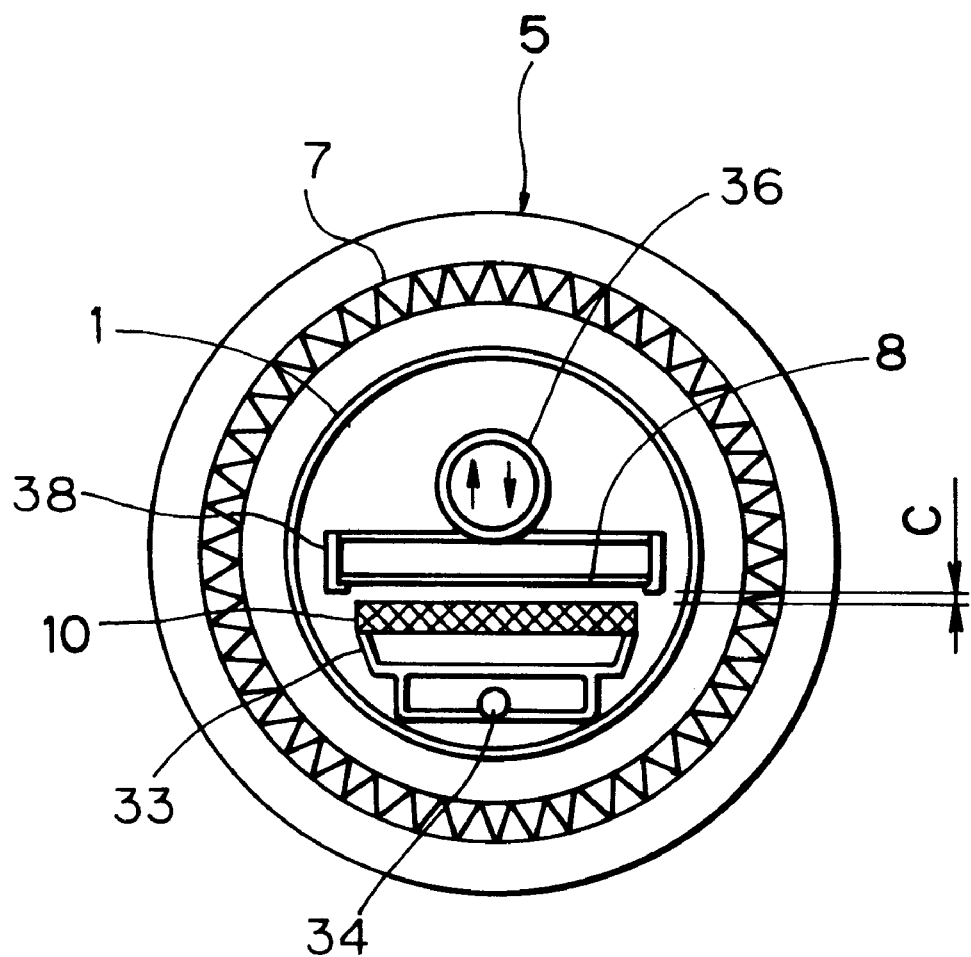
FIG. 8 is a cross-sectional view of the high-temperature portion of the apparatus shown in FIG. 7.
Figure 9:
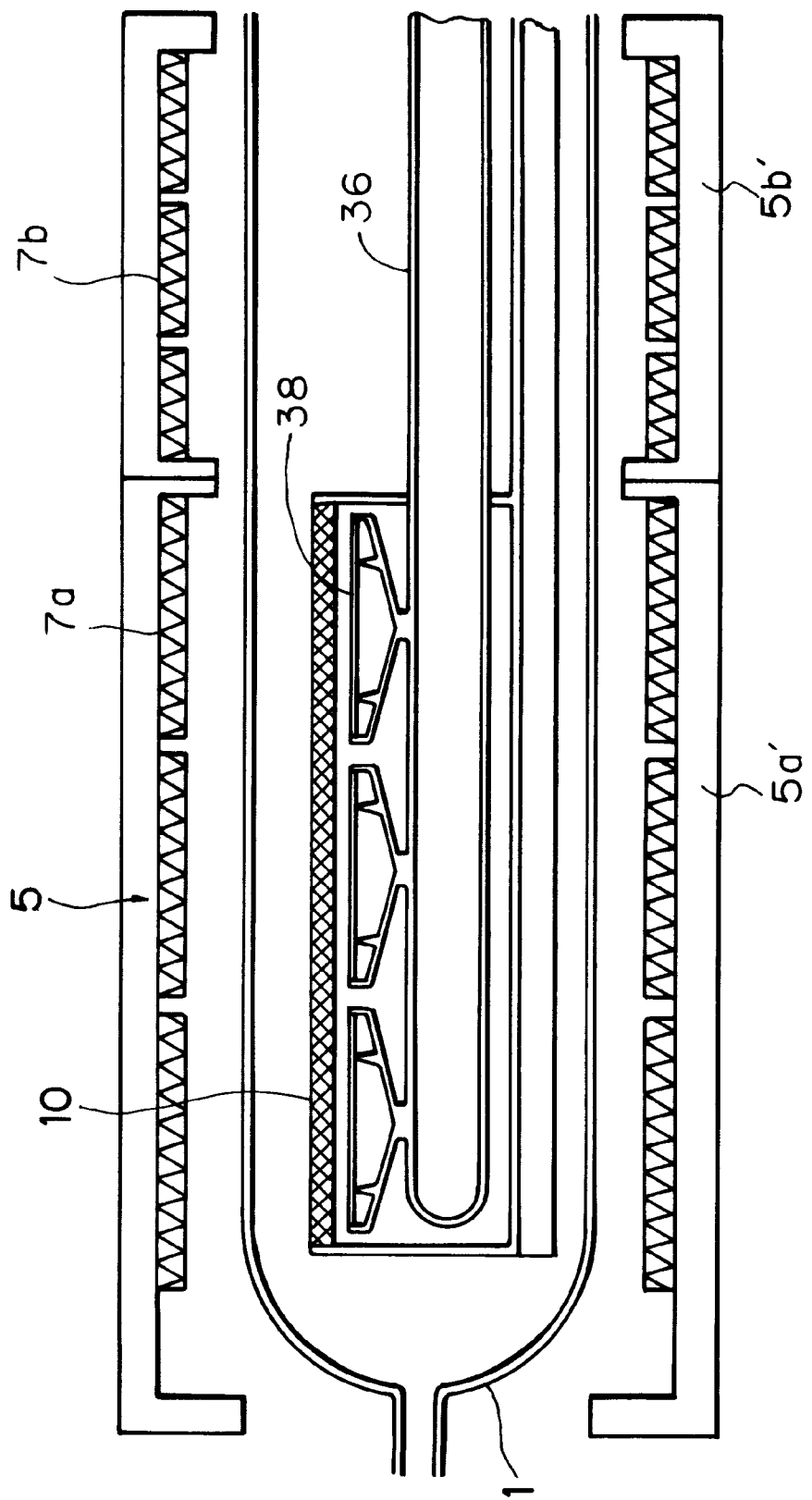
FIG. 9 shows a horizontal heating furnace, in which the wafers are heated in the direct vicinity of the thermal storage plates at a high temperature, and illustrates another embodiment of the method according to the present invention.

FIGS. 7 through 9 shows a horizontal CVD apparatus under normal pressure, in which the first and second methods of the present invention are applied.

In FIGS. 7 and 8, the wafers 8 are located above or on the thermal storage plate 10. Three resistance heaters 7a are provided in a high-temperature furnace 5a, while three resistance heaters 7b are provided in a low-temperature furnace 5b. Two wafers 8 are first heated in the low-temperature furnace 5b and are then displaced by the wafer-holder 36 into the high temperature furnace 5a, until they (8a) reach above the thermal storage plate 10. The wafers 8 are then lowered into the direct vicinity of the thermal storage plate 10 and are thus subjected to the radiant heat from the thermal storage plate 10. The distance (c) between the wafers 8 and the thermal storage plate 10 is preferably 10 mm or less. Alternatively, the wafer-holder 36 may be lowered until the wafers 8 are placed on the thermal storage plate 10. The wafers 8 are then heat treated while they are in contact with the thermal storage plate 10. The wafer-holder 36 is then lifted so that it resumes its position as shown in FIG. 7.

The wafer-holder 36 is a hollow tube which is held by a known cantilever mechanism and displaces, elevates and lowers the wafers while they are not in contact with the quartz reaction tube. The lugs 38 protrude downward from the bottom of the hollow tube and support the wafers 8. The thermal storage plate 10 is supported on the pedestal 33 and is displaced into and from the furnace by means of a rod 34.

In FIG. 9 the thermal storage plate 10 is located above the wafers 8. The members denoted by the same numbers as in FIGS. 7 and 8 are the same members. In FIG. 9, the heat treatment can be carried out while the wafers 8 are brought into contact with the thermal storage plates 10 or positioned in the direct vicinity of the thermal storage plates 10.

Figure 10B:
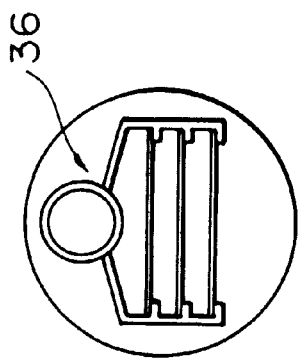
FIG. 10 is a cross sectional view of a horizontal heating furnace, in which the wafers are to be brought into contact with and heated by the thermal storage plates, and illustrates a further example of the second method of the present invention.
Figure 10A:
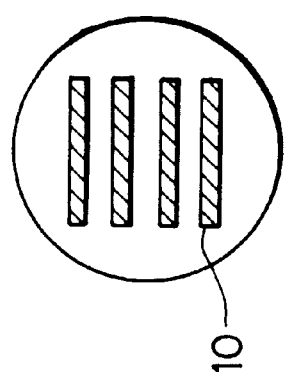
Figure 10:
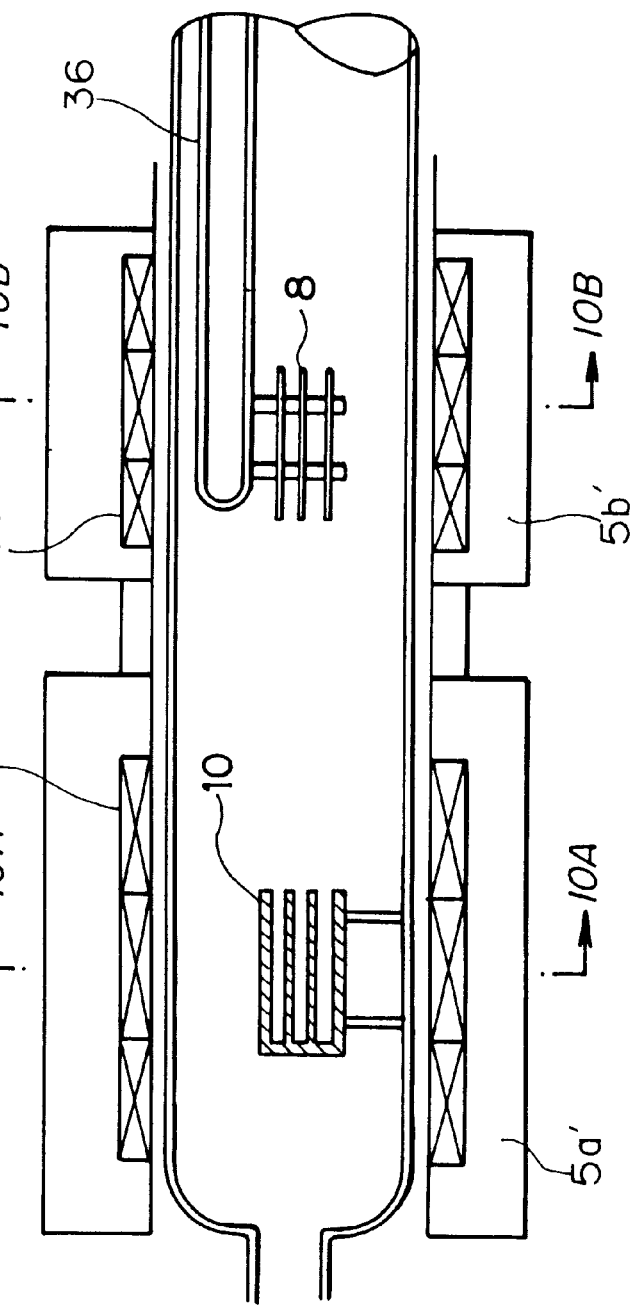

In FIG. 10, the four thermal storage plates 10 are located in the high-temperature region and are vertically arranged. The three wafers 8 are forwarded in between the thermal storage plates 10 by means of a wafer-holder 36. After the wafers 8 are forwarded, the wafer-holder 36 is lowered to place the wafers 8 on the thermal storage plates 10. The wafer-holder 36 is then elevated and then retracted.

In an embodiment of the second method of the present invention, a number of the apertures may be formed in the thermal storage plate 10 so as to flow the gas therethrough. However, the gas must be heated to the heat treating temperature and then passed through the apertures so as not to impede the effect of the thermal storage plate 10. The gas may be a reaction gas which directly reacts with a wafer and forms such as $SiO_2$, $Si_3N_4$, SiON or the like. The gas may also be a CVD gas. Uniform thin film may be formed on a large-diameter wafer.

Figure 11:
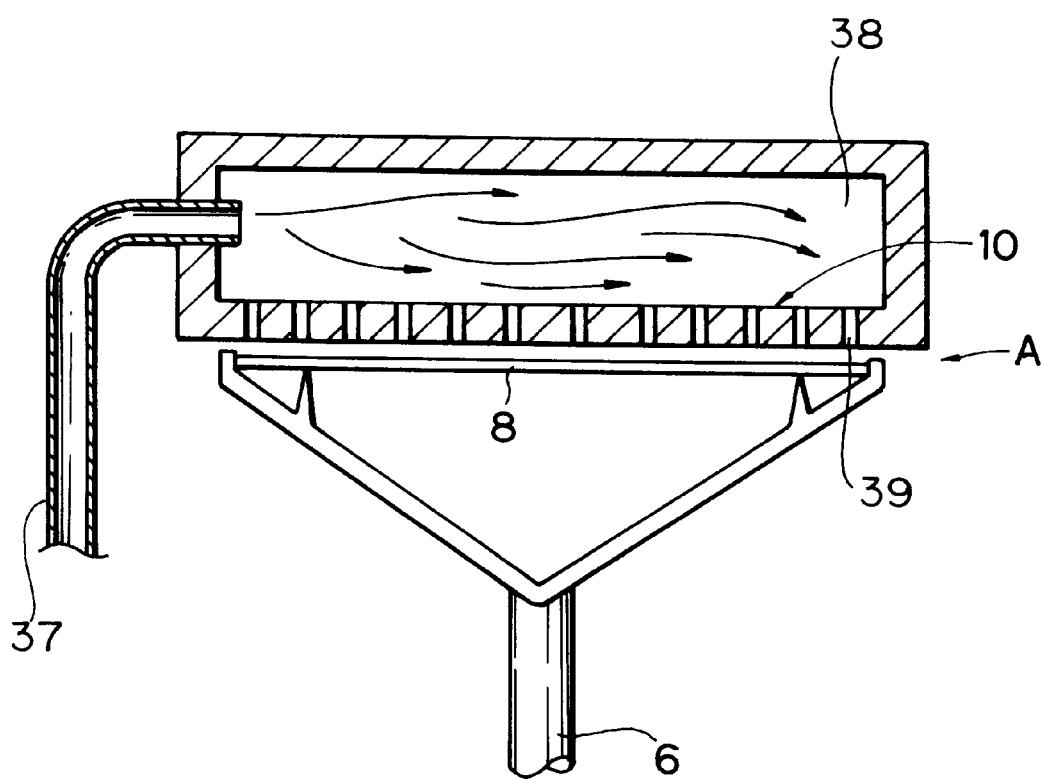
FIG. 11 shows a thermal storage plate, in which the apertures for flowing gas are formed.
Figure 12:
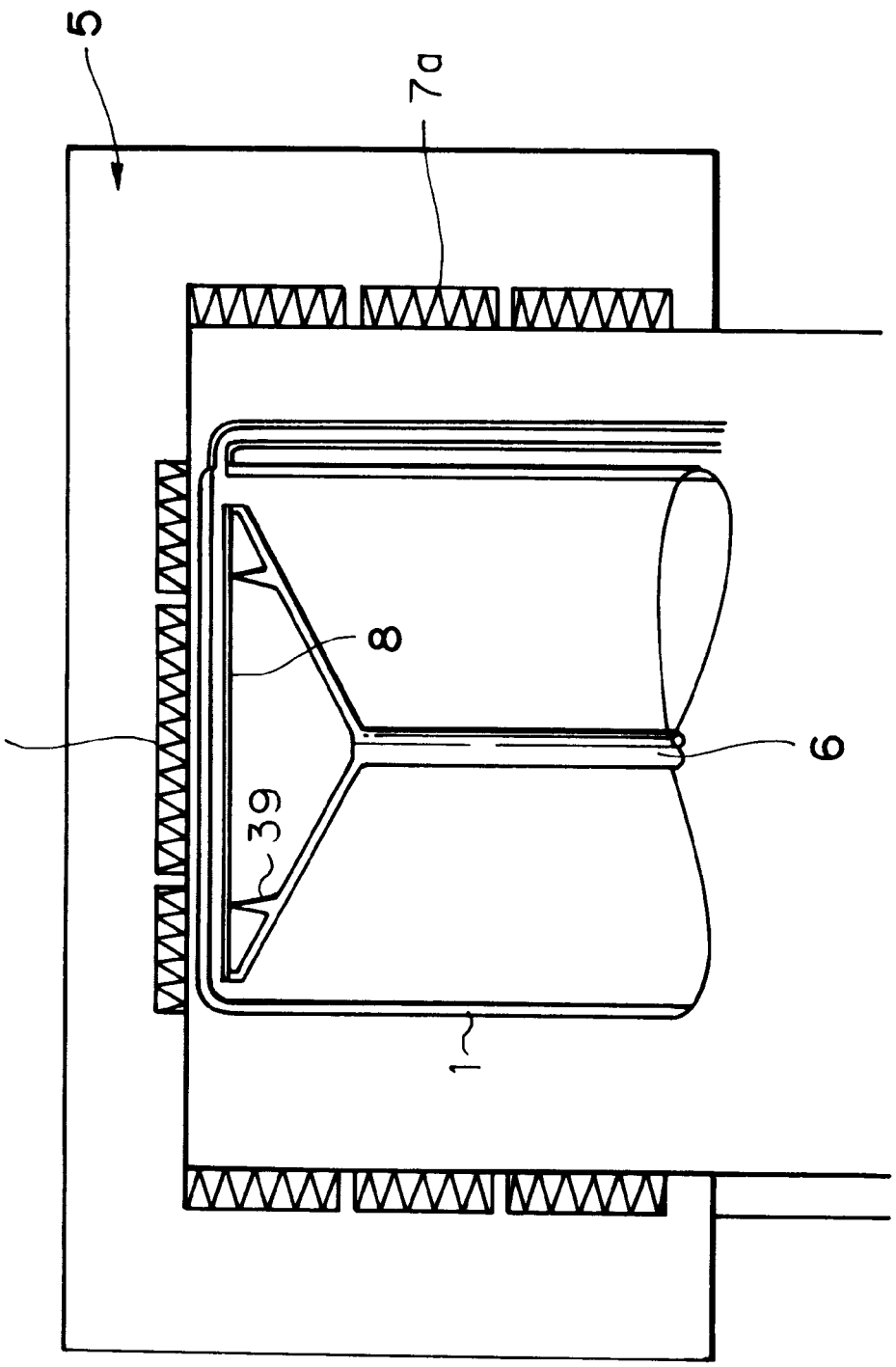
FIG. 12 shows a vertical, hot-wall type heating furnace and illustrates an embodiment of the method of the present invention.

Referring to FIG. 11, the apertures 39 having a diameter of from 0.2 to 0.5 mm are formed in the thermal storage plate 10 and are distributed in a honeycomb form. The number of the apertures 39 may be ten or more, but usually from ten to twenty. Gas is fed from a supplying conduit 37 into a distribution chamber 38, where the gas concentration is made thoroughly uniform by mixing of the gas. The gas then passes through the apertures 39 and are applied on the wafer 8 in the form of a shower. Since the wafer 8 is located in the direct vicinity of the thermal storage plate 10, it is possible to prevent the gas from flowing in the arrow direction A onto the wafer surface and hence causing non-uniform thickness in the distribution of a film thickness on the wafer 8. It is preferred that the inflow of gas through the supplying conduit 37 be initiated when the wafer 8 arrives at a position in the direct vicinity of the thermal storage plate 10.

The third method according to the present invention can be implemented in such a manner that a wafer 8 is positioned in the direct proximity of the upper heater 7c.

In a horizontal reaction furnace under normal pressure, the quartz tube of the furnace has a rectangular or square cross section, and the heaters consist of flat sections which are connected to the rectangular or square form. A wafer(s) can therefore be moved close to a flat section of the heaters.

What is claimed is:

1. A method for producing a semiconductor device, in which a wafer or wafers are arranged and heat treated in a hot-wall type heating furnace, provided with a reaction tube and a resistance heater located outside the reaction tube, comprising the steps of:

preliminarily heating a plurality of opposed thermal storage plates located inside the reaction tube to a heat-treating temperature by said resistant heater of said hot-wall type heating furnace; and subsequently, positioning one wafer or opposed two wafers between the opposed thermal storage plates, in such a manner that essentially entire surface of the wafer or wafers is opposite to at least a partial region of the thermal storage plates, thereby elevating the temperature of the wafer or wafers to the heat-treating temperature with heat radiation generated from both the thermal storage plates and the resistance heater.

2. A method according to claim 1, further comprising a step of heating a reaction gas to said heat-treating temperature and passing said reaction gas through apertures formed in the thermal storage plate toward the wafer or wafers.

* * * * *